United States Patent
Nuxoll et al.

(10) Patent No.: US 6,307,769 B1
(45) Date of Patent: Oct. 23, 2001

(54) SEMICONDUCTOR DEVICES HAVING MIRRORED TERMINAL ARRANGEMENTS, DEVICES INCLUDING SAME, AND METHODS OF TESTING SUCH SEMICONDUCTOR DEVICES

(75) Inventors: James P. Nuxoll; Steven L. Hamren, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/388,440

(22) Filed: Sep. 2, 1999

(51) Int. Cl.[7] ................................................. G11C 5/06
(52) U.S. Cl. ................................................. 365/63; 365/51
(58) Field of Search ................................. 365/52, 63, 51

(56) References Cited

U.S. PATENT DOCUMENTS

| | | | |
|---|---|---|---|
| 5,008,776 | * 4/1991 | Queyssac | 361/392 |
| 5,103,247 | * 4/1992 | Sugano et al. | 361/400 |
| 5,126,910 | * 6/1992 | Windsor et al. | 361/42 |
| 5,270,946 | 12/1993 | Bechtolsheim et al. | 365/52 |
| 5,502,621 | 3/1996 | Schumacher et al. | 361/760 |
| 5,667,077 | 9/1997 | Goins, III | 209/573 |
| 5,835,505 | * 11/1998 | Nishimichi et al. | 371/22.1 |

* cited by examiner

*Primary Examiner*—David Nelms
*Assistant Examiner*—Thong Le
(74) *Attorney, Agent, or Firm*—Dickstein Shapiro Morin & Oshinsky LLP

(57) ABSTRACT

Disclosed are semiconductor devices having terminal arrangements in which mirrored pairs of the semiconductor devices can be tested by a common test device.

26 Claims, 6 Drawing Sheets

SEMICONDUCTOR DEVICES HAVING MIRRORED TERMINAL ARRANGEMENTS, DEVICES INCLUDING SAME, AND METHODS OF TESTING SUCH SEMICONDUCTOR DEVICES

FIELD OF THE INVENTION

This invention relates generally to packaged semiconductor chip devices which have mirrored external terminals. The present invention further relates to memory modules and other devices which include such mirrored packaged semiconductor chip devices, test devices for testing mirrored packaged semiconductor devices, and methods of testing such mirrored packaged semiconductor devices.

BACKGROUND OF THE INVENTION

Semiconductor chip devices, or so-called "dice," are well known in the art. Such devices may include combinations of any of a large number of active semiconductor components, such as diodes and/or transistors, with various passive components, such as capacitors and/or resistors, all residing on a wafer, e.g., made of silicon or gallium arsenide, or other materials. Many different types of semiconductor chip devices are made using different combinations of materials and known manufacturing procedures. Typically, a starting substrate, such as a thin wafer of silicon, is subjected to various combinations of steps such as material deposition, oxidizing, nitridizing, ion implantation, diffusion, doping, masking, etching and others. In these treatments, the specific materials and sequence of steps are selected so as to produce semiconductor components having specific desired functions. The semiconductor components are arranged so as to provide a semiconductor chip device having specified functions, for example, as a memory, such as an SRAM or a DRAM, as is well known in the art.

Each semiconductor chip device has a plurality of die bond pads positioned on or in the chip device which are connected to external terminals or "pins" of an integrated circuit package. It is through these terminals or pins of a package that the semiconductor chip device, and thus the semiconductor components in the chip, electrically communicate with the outside world.

Each different terminal or pin connects to circuitry in or on the semiconductor chip device which provides a particular function. For example, a memory chip may have input-output lines (such as data lines), input only lines (such as clock lines or address lines), ground lines, and one or more power lines. It is through these individual connections that the semiconductor chip device derives all necessary power, ground, input-output and input only signals. There are a variety of known semiconductor chip devices and associated packages which include a large number of such terminals, and as chips become even more dense and feature rich, the number of external terminals required continues to grow.

A common example of a commercial article which includes packaged memory chip devices is a memory module. A memory module typically includes several packaged memory chip devices mounted on a module board, e.g., a printed circuit board. In such a module, each packaged memory chip device has a plurality of external terminals electrically connected to a respective module board electrical connector. The module board provides physical support for the packaged semiconductor device, and electrically connects it to other external circuitry via the module board electrical connectors.

Examples include single in-line memory modules (SIMM's), which are multi-chip memory modules having multiples of the same basic die. In a SIMM, the semiconductor memory chips are typically aligned in a row and interconnected on a printed circuit board to, in effect, create a single device with the memory capacity of the combined memory chips. The wiring pattern of the printed circuit board connects packaged semiconductor devices to module terminals, e.g., along one edge of the printed circuit board. The module terminals may be configured for attachment to an edge-type connector, such as a SIMM socket, as is known in the art.

Another known memory module is a dual in-line memory module (DIMM). On a DIMM, memory chips are mounted on both surfaces of a circuit board. To simplify the mounting and wiring a memory module having packaged memory chips on both sides of the module board, mirrored packaged memory chips have been developed, so that a packaged memory chip can be mounted on one side of the board and a mirror image of the packaged memory chip can be mounted to the same module board pads on the other side of the board. Such pairs of packaged memory chips are referred to as "mirror pairs" or "mirror images", i.e., the external terminals of each mirror pair are positioned opposite one another on opposite surfaces of the module and connect to the same board bonding site. The expressions "mirror pair" and "mirror image" are used herein to refer to pairs of packaged memory chips having external terminal arrangements which are asymmetrical. The external terminal arrangements of members of a mirror pair, e.g., memory chips, which are mirror images of each other, are necessarily non-identical. The expression "mirror pair" is used herein to refer to the packaged memory chips whether or not one or both of them are attached to a module board (i.e., on opposite sides of the module board). Also, one member of a mirror pair is referred to herein as a "mirror pair" of the other member and/or a "mirror image" of the other member.

In the manufacture of any of the many articles which include one or more packaged semiconductor chip devices, e.g., memory devices, it has been found that it is inefficient and wasteful to construct the entire article, or a substantial part of it, and later discover that one or more of the packaged semiconductor chip devices is defective or damaged. Therefore, packaged semiconductor chip devices are usually tested prior to mounting them on a circuit board or module. For example, such testing includes testing the die devices for speed and for errors which may occur after fabrication and after burn-in. Burn-in testing is typically conducted at elevated potentials and for a prolonged period of time (e.g., 24 hours), at varying and reduced and elevated surrounding temperatures (such as −15° C. to 125° C.). Such burn-in testing is designed to accelerate failure mechanisms such that die devices which have the potential to prematurely fail during normal operation can be identified and eliminated.

Test devices typically include electrical contact elements (or test head pads), as well as structure, such as a socket or other connection, which acts alone or in combination with a carrier to hold the article being tested at a specific location and in a specific orientation. Since the article is constructed so as to conform to specific dimensional specifications, the electrical contact elements in the test devices reliably make electrical connection with the respective die bondpads on the article, or they make connection with respective elements, e.g., external package terminals, which are in electrical connection with the internal semiconductor device circuitry.

The testing of the packaged semiconductor chip device typically comprises a first series of electrical tests, burn-in of the chip, and a second series of electrical tests. The electrical tests may comprise, for instance, a set of tests to verify that the semiconductor die meets certain speed specifications, a set of tests to verify that the chip device meets specific voltage, capacitance and current specifications, and a set of tests to verify that the chip properly performs the function or functions for which it was designed and over a desired lifespan.

Test devices, including a burn-in oven and test equipment, are relatively expensive. In addition, test devices require electrical circuitry which is specific to the external terminal arrangement on the packaged device being tested. For example, with the test device described above, for each type of packaged device (i.e., for each external terminal arrangement), it is necessary to have a specially designed lid and/or a specially designed carrier.

In the case of mirrored packaged memory chips, the two members of a mirror pair have different (i.e., mirror image) external terminal arrangements, which are not identical to one another. It has therefore not been possible to easily test both types of packaged memory chips of a mirrored pair using a single test device. In addition, damage can occur if a chip which is of one type of chip in a mirror pair is in error brought into engagement with a test device adapted for testing the other type of chip in that mirror pair. Since the one type of chip in the mirror pair is a mirror image of the other type of chip in the mirror pair, the electrical contact elements in the test device will be in contact with incorrect external terminals (mismatching). When such mismatching takes place it is possible to severely damage the memory chip and/or the test device. As a result, in order to test the two types of chips used in a mirrored memory module, it has been necessary to incur the cost of two types of testing hardware, to provide space for the two types of hardware, to expend the time required to change a component in a test device, and/or to separately test the members of a mirror pair.

Attempts have been made to simplify the testing of IC chips or modules containing them. U.S. Pat. No. 5,667,077 discloses an apparatus for testing and handling multi-chip modules (MCM's). The patent discloses a double-sided MCM in position for testing by a test device. The test device makes electrical contact with the edge connector traces of the MCM using upper and lower contactor pins. The upper and lower contactor pins are mounted into upper and lower contactor assemblies which are programmed to raise and lower, as necessary, to make contact with the MCM when it is in position and ready for testing.

U.S. Pat. No. 5,502,621 discloses that in the past, circuit boards incorporating more than one IC of the same type have been simplified and that problems associated with crossover and crosstalk have been minimized by using pairs of integrated circuits designed with two identical but reversed pin assignments. This patent discloses circuit boards having at least one IC mounted on each side of a two sided board which use one or more ICs having pin assignments arranged as a mirror image of each other along a centerline through the IC package in the X or Y axis. The patent discloses that mounting one or more ICs having the same set of mirror image pin assignments on each side of a circuit board and rotated 180 degrees in relationship to each other will ensure that the pin assignments of the same type (such as ground and power) will be directly opposite each other and separated by the circuit board. Various ground, power, data, strobe, clock and address leads around the chip package have pin assignments which are positioned as a mirror image of each other. These pin assignment requirements thus require that the pin assignment arrangement be symmetrical about the mirror axis. In addition, these pin assignment requirements make it necessary that each pin assignment be duplicated in the packaged device.

U.S. Pat. No. 5,270,964 discloses a SIMM having a connector including contact regions, each of which consist of a large number of closely spaced contact pads on one side of the SIMM and a mirror image yet electrically distinct set of contact pads on the other side of the SIMM. All power and ground leads are symmetrically arranged within the connector, the power and ground leads alternating every sixteen pins. According to the patent, if the SIMM is inadvertently inserted in a reversed position into a memory module socket, the symmetrical power ground leads prevent the SIMM from being reverse-powered, and likely destroyed.

Significant capital savings and process simplification would be obtained by providing a packaged semiconductor device which can be tested using the same test device as is used to test the mirror image packaged semiconductor device. There is furthermore a need for a packaged semiconductor device which eliminates the possibility of damage to the packaged semiconductor device and/or the test device resulting from mismatching caused by engaging the incorrect member of a mirror pair with a test device designed for the other members of the mirror pair.

SUMMARY OF THE INVENTION

The present invention provides packaged semiconductor devices each having one or more semiconductor components and a plurality of external terminals. The external terminals are each of a particular function type, such function types including (1) input-output, (2) input only, (3) power and (4) ground. In some implementations there may also be various levels and their classifications of the power terminals. For example, in one more specific memory device aspect the plurality of external terminals are classified by function as (1) input-output, (2) input-only, (3) power for CMOS input and output pins, (4) power for the RDRAM core and interface logic or for the RDRAM analog circuitry, (5) power for threshold reference voltage for RSL signals and (6) ground. The external terminals of packaged semiconductor device according to the present invention are arranged such that the function type of each external terminal of the packaged semiconductor device is the same as that in a corresponding location of a mirror image of the packaged semiconductor device. In other words, for the purpose of explanation, each external terminal of the packaged semiconductor device is classified according to whether it carries input and output (i.e., an input-output terminal), input only (i.e., an input terminal), power and ground. As noted, the power may be further classified and in one specific aspect, each external terminal is classified according to whether it carries input and output, input only, power for CMOS input and output pins (i.e., a power for CMOS input and output pins terminal), power for the RDRAM core and interface logic or for the RDRAM analog circuitry (a power for the RDRAM core and interface logic or for the RDRAM analog circuitry terminal), power for threshold reference voltage for RSL signals and ground pins (i.e, a power for threshold reference voltage for RSL signals and ground pins terminal) or ground (i.e., a ground terminal). This classification is referred to herein as the "function assignment" of a terminal, and the arrangement of the terminals of a packaged semiconductor device is referred to herein as the "function assignment arrangement" of the device. Thus, the function assignment arrangement of a packaged semiconductor device according to the present invention is identical to the function assignment arrangement of a mirror image of that packaged semiconductor device.

There are further provided test devices having pads arranged for engaging the external terminals of the packaged semiconductor device being tested, with the test device pads being electrically connected to circuitry for delivering and receiving input-output, input, power and ground, or for the more specific aspect of the invention, input-output, input, power for CMOS input and output pins, power for the RDRAM core and interface logic or for the RDRAM analog circuitry, power for threshold reference voltage for RSL, and ground signals. As with the external terminals of packaged semiconductor devices, the test device pads are each classified, for purposes of explanation, according to their articular function. In accordance with the present invention, the test device pads have a function assignment arrangement which matches the function assignment arrangement of the packaged semiconductor device being tested.

For each semiconductor chip device according to the present invention, and its mirror pair, a single test device can be used to test both members of the mirror pair.

Depending upon which of the two members of the mirror pair is being tested (this information can be input by the user or sensed from information on the packaged device itself, software applies the corresponding pad assignments to the pads on the test device. In other words, when one member of a mirror pair is being tested, based on information as to which member of the mirror pair is being tested, software causes signals to be re-routed and/or altered, as necessary, internally in order to properly complete the test. Software can accommodate both members of a mirror pair, because it can modify the pattern of signals sent from the test device to account for the substitution of one terminal of a particular function assignment for another terminal of the same function assignment (e.g., one input-output terminal may be in a particular location on one member of a mirror pair, and a different input-output terminal may be in that location in the other member of the mirror pair). However, software cannot easily account for substitution of a terminal of one function type for a terminal of another function type. Although the terminal arrangements of both members of mirror pairs according to the present invention are asymmetrical, the function assignment arrangements of both members of such mirror pairs are symmetrical, so that the external terminal in any position of one member of a mirror pair is the same as the external terminal located in the corresponding position of the other member of the mirror pair.

Also, in the event that a packaged device is being tested and the function assignment arrangement of the test device is incorrectly set for the mirror image of the packaged device, there is no possibility for damage to the device or the test device. Contrary to prior art devices, such damage is avoided because all pins of both members of a mirror pair according to the present invention are connected to pins of the same function type in the test device.

The present invention also relates to mirrored memory modules which include one or more semiconductor chip devices according to the present invention, in particular, mirror pairs in which the respective members of each mirror pair are positioned on opposite sides of a module board. The present invention further relates to process devices, e.g., computers, workstations, etc., which include such mirrored memory modules having the terminal arrangement of the invention.

In addition, the present invention relates to methods of testing semiconductor chip devices using test devices capable of accepting either member of a mirror pair.

These and other features and advantages of the invention will become more readily apparent from the following detailed description of preferred embodiments of the present invention which is provided in conjunction with the accompanying drawings. The invention is not limited to the exemplary embodiments described below and it should be recognized that the invention includes all modifications falling within the scope of the attached claims.

DETAILED DESCRIPTION OF PREFERRED EMBODIMENTS OF THE INVENTION

According to the present invention, there are provided packaged semiconductor devices each having one or more internal semiconductor components in any combination and a plurality of external terminals including one or more input-output terminals, one or more input only terminals, one or more ground terminals, one or more power terminals. The power terminals may also be further classified into different types of power terminals. For purposes of illustrating the invention the external terminals are for a memory device and include one or more input-output terminals, include one or more input-output only terminals, one or more ground terminals, one or more power terminals for CMOS input and output pins, one or more power terminals for the RDRAM core and interface logic or for the RDRAM analog circuitry, and one or more power terminals for threshold reference voltage for RSL signals. The external terminals are connected to specific semiconductor components within the packaged device. The expression "terminal" is used herein with a packaged semiconductor device to refer to any structure which functions to transmit electrical signals which are conducted to or from one or more semiconductor devices, e.g., dies, inside the semiconductor device package.

An example of a packaged semiconductor device according to the present invention is a memory chip or die contained on an FR-4 substrate with BGA terminals.

Figure 1A:
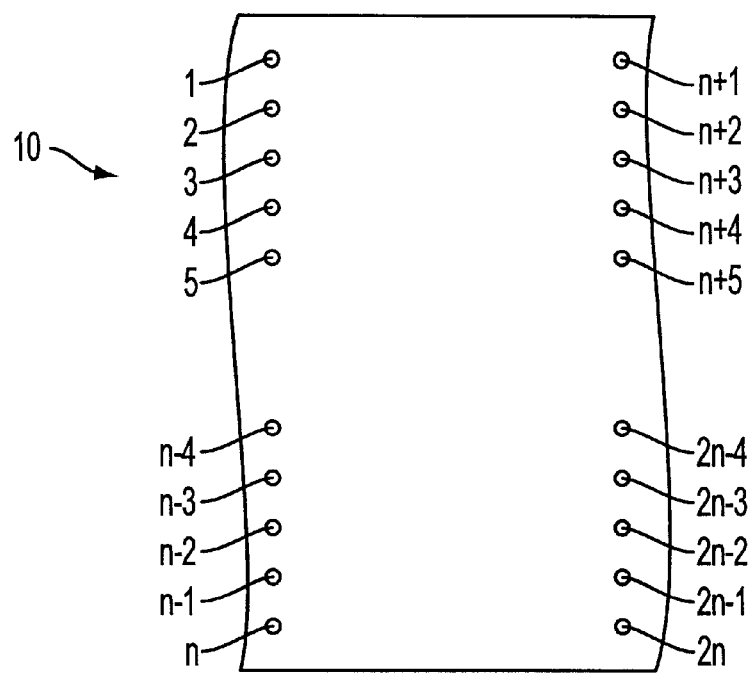
FIG. 1A is a schematic underside view of a packaged semiconductor device, e.g., a memory device, which is one of a mirrored pair of packaged devices, according to the present invention.

Referring now to the drawing Figures, FIG. 1A shows an embodiment of a packaged semiconductor device 10 in accordance with the present invention, in which the quantity of terminals is 2n, the respective terminals being labeled from 1 through 2n. The semiconductor chip device 10 comprises one or more semiconductor components (not shown) formed by any combination of steps known in the art, e.g., oxidizing, nitridizing, ion implantation, diffusion, doping, masking, etching, etc., as discussed above. Although FIG. 1A shows a packaged device 10 having 2n terminals, the packaged devices 10 according to the present invention can have any desired number of terminals.

In accordance with one aspect of the invention, the terminals of a packaged semiconductor device are arranged such that its function assignment arrangement is the same as the function assignment arrangement of a mirror image of the packaged semiconductor device.

Accordingly, in FIG. 1A, which shows the underside of a packaged semiconductor device, which for purposes of illustration will be assumed to be a memory device. If terminal 1 is an input-output terminal, then (if the mirroring is vertical) terminal n must be an input-output terminal, or (if the mirroring is horizontal) terminal n+1 must be an input-output terminal. Likewise, if terminal 1 is an input only terminal, then terminal n or terminal n+1 is an input only terminal, if terminal 1 is a ground terminal, then terminal n or terminal n+1 is a ground terminal, if terminal 1 is a power terminal for CMOS input and output pins, then terminal n or terminal n+1 is a power terminal for CMOS input and output pins, if terminal 1 is a power terminal for the RDRAM core and interface logic or for the RDRAM analog circuitry, then terminal n or terminal n+1 is a power terminal for the RDRAM core and interface logic or for the RDRAM analog circuitry, and if terminal 1 is a power terminal for threshold reference voltage for RSL signals, then terminal n or terminal n+1 is a power terminal for threshold reference voltage for RSL signals. Similarly, if terminal 2 is an input-output terminal, then (if the mirroring is vertical) terminal n−1 must be an input-output terminal, or (if the mirroring is horizontal) terminal n−2 must be an input-output terminal. Likewise, if terminal 2 is an input only terminal, then terminal n−1 or terminal n+2 is an input only terminal, if terminal 2 is a ground terminal, then terminal n−1 or terminal n+2 is a ground terminal, if terminal 2 is a power terminal for CMOS input and output pins, then terminal n−1 or terminal n+2 is a power terminal for CMOS input and output pins, if terminal 2 is a power terminal for the RDRAM core and interface logic or for the RDRAM analog circuitry, then terminal n−1 or terminal n+2 is a power terminal for the RDRAM core and interface logic or for the RDRAM analog circuitry, and if terminal 2 is a power terminal for threshold reference voltage for RSL signals, then terminal n−1 or terminal n+2 is a power terminal for threshold reference voltage for RSL signals. Similar identities of function assignments are required (in the case of horizontal mirroring) between terminal 3 and terminal n+3, terminal 4 and terminal n+4, etc., respectively, or (in the case of vertical mirroring) between terminal 3 and terminal n−2, terminal 4 and terminal n−3, etc.

Figure 1B:
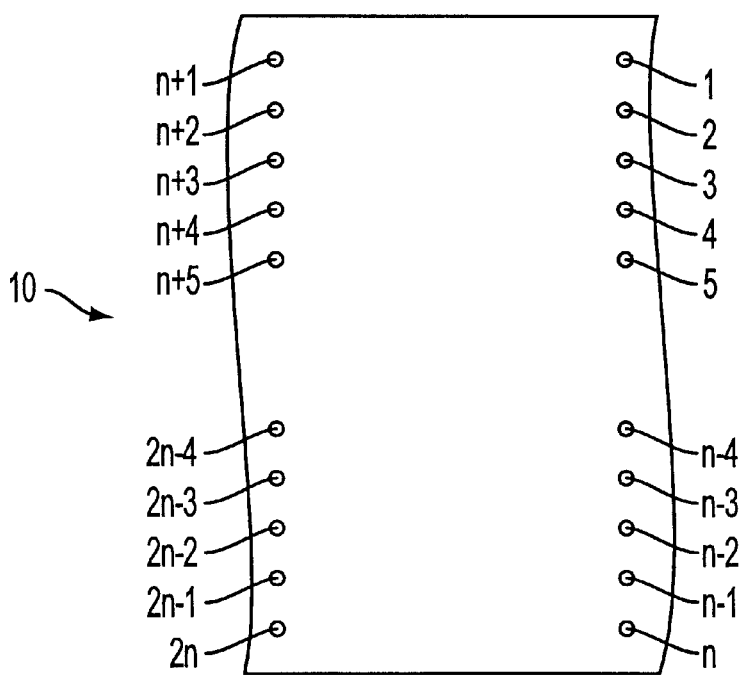
FIG. 1B is a schematic underside view of a side-to-side mirrored packaged semiconductor device of the mirrored pair of packaged devices.
Figure 1C:
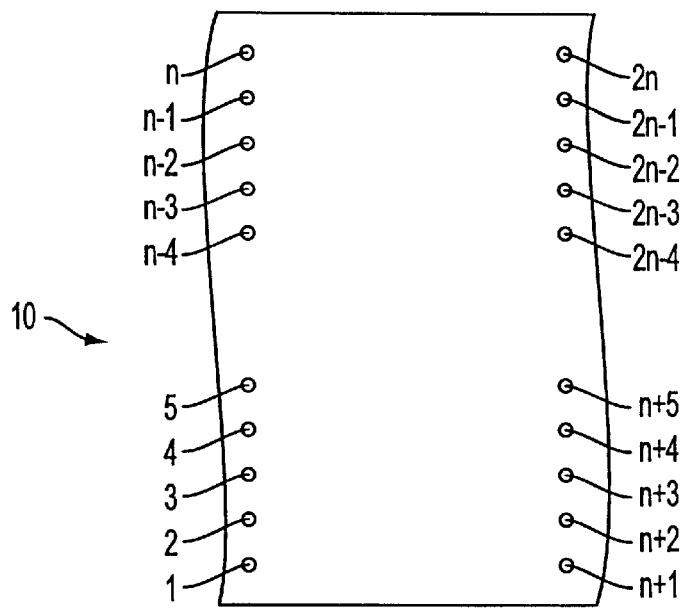
FIG. 1C is a schematic underside view of a top-to-bottom mirrored packaged semiconductor device of the mirrored pair of packaged devices.

The terminal arrangements just described refer to vertical mirroring, i.e., based on a mirror axis drawn vertically, where the mirror image is a right to left mirror image of FIG. 1A, as shown in FIG. 1B, or horizontal mirroring, i.e., based on a mirror axis drawn horizontally, where the mirror image is a top to bottom mirror image of FIG. 1A, as shown in FIG. 1C. It should be noted that a top to bottom mirror image of FIG. 1A, as shown in FIG. 1C, results in a terminal arrangement which is identical to that shown in 1B, with the terminal arrangement in FIG. 1C merely being rotated 180 degrees about a vertical axis relative to the arrangement in FIG. 1B. Thus, if one packaged semiconductor device has the terminal arrangement shown and described with reference to FIG. 1A and the mirror image packaged semiconductor device has the terminal arrangement shown in FIG. 1B, the mirrored pair of packages can be connected to the same terminals on opposite sides of a mounting substrate such as a printed circuit board. Moreover, no matter which of the FIG. 1A, or FIG. 1B packages are being tested, the terminals will correspond with like function terminals of a test device. That is, the function assignment arrangement of a packaged device will correspond with the function assignment arrangement of the test device.

The packaged semiconductor devices of the present invention achieve significant capital savings and process simplification, because both devices of a mirror pair can be tested using the same test device, particularly in the course of manufacturing a memory module having one or more mirror pairs of semiconductor devices with the member of each mirror pair being on the opposite side of the module. In addition, the present invention eliminates the possibility of damage to the semiconductor chip device and/or the test device resulting from mismatching, because the arrangement of external terminals prevents mismatching any combination of an input-output line, an input only line, a ground line, a power line for CMOS input and output pins, a power line for the RDRAM core and interface logic or for the RDRAM analog circuitry, or a power line for threshold reference voltage for RSL signals.

The present invention is further directed to a test device having pads arranged for engaging the external terminals of the packaged semiconductor device being tested, with the test device pads being electrically connected to circuitry for delivering and receiving input-output, input only, ground line, power for CMOS input and output pins, power for the RDRAM core and interface logic or for the RDRAM analog circuitry, or power for threshold reference voltage for RSL signals. The test device pads have a function assignment arrangement which is identical to the function assignment arrangement of the die being tested. As such, input-output external terminals of the packaged semiconductor device engage input-output pads of the test device, input only external terminals of the packaged semiconductor device engage input only pads of the test device, ground external terminals of the packaged semiconductor device engage ground pads of the test device, power line for CMOS input and output pins external terminals of the packaged semiconductor device engage power line for CMOS input and output pins pads of the test device, power line for the RDRAM core and interface logic or for to RDRAM analog circuitry external terminals of the packaged semiconductor device engage power line for the RDRAM core and interface logic or for the RDRAM analog circuitry pads of the test device, and power line for threshold reference voltage for RSL signals external terminals of the packaged semiconductor device engage power line for threshold reference voltage for RSL signals pads of the test device.

Figure 2:
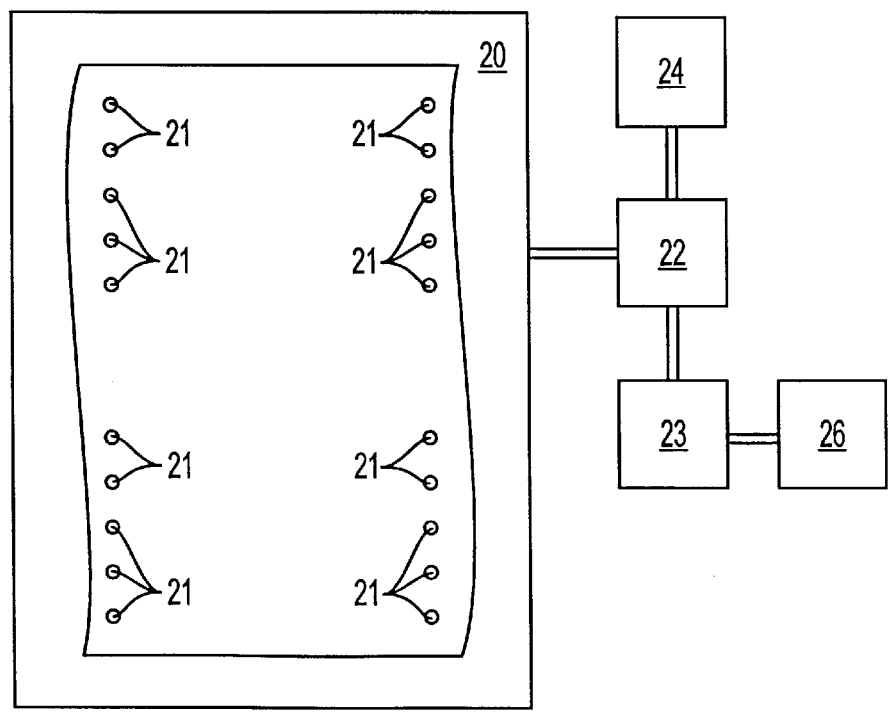
FIG. 2 is a schematic plan view of a test device according to the present invention.

FIG. 2 is a schematic representation of a test device, including a test head 20 having a plurality of test device pads 21. When a packaged semiconductor device is being tested using this embodiment, the external terminals 1–2n of a packaged semiconductor device as shown in FIG. 1A or FIG. 1B are brought into contact with the test device pads 21. The test head 20 includes circuitry for carrying signals between the test device pads 21 and apparatus 24 which contains logical and other components which can test whether the packaged semiconductor device functions as it is intended to function, varieties of such circuitry and apparatus being known in the art. FIG. 2 also schematically shows test electronics 22 and a control CPU 23. The test electronics 22 routes signals between pads 21 and the test apparatus 24. For example, such signals include signals which are analogous to the signals which will be routed to a packaged semiconductor device in use, such that the tests can be used to check whether the device meets specific speed specifications, voltage, capacitance and current specifications, and/or to check whether the device properly performs the function or functions for which it was designed (initially or over a desired lifespan). The arrangement depicted in FIG. 2 further includes a selector 26, e.g., a switch, which can be moved between two positions depending on which member of a mirror pair of packaged semiconductor devices is being tested. By selecting one position or the other, the selector 26 instructs the CPU 23 to control electronics 22 to route the appropriate signals to/from test apparatus 24 to/from the appropriate test pads in the test device 20. The CPU causes the signals supplied to/from the test pads 21 to be mirrored across an axis which is in the same direction (e.g., vertical) as the axis across which the functions of the terminals in the packaged semiconductor device are mirrored. Software in the CPU can control voltage levels and timing and sequence for rearranging specific terminals within a class and suitably configuring electronics 22 so that appropriate terminals 21 are connected to appropriate conductors of test apparatus 24, depending on which of the mirrored packages is under test. Instead of a switch (or other external manual device), other input devices can be used to determine which device of a mirrored pair is connected to the test and instruct automatically switch (if necessary) to the correct setting, and then perform the testing.

The present invention is further directed to methods of testing packaged semiconductor devices according to the present invention as described above. According to these methods, the test device pads 21 are brought into contact with the external terminals of the packaged semiconductor device, and testing is carried out to determine whether the semiconductor device performs the functions it is intended to perform.

Figure 3A:
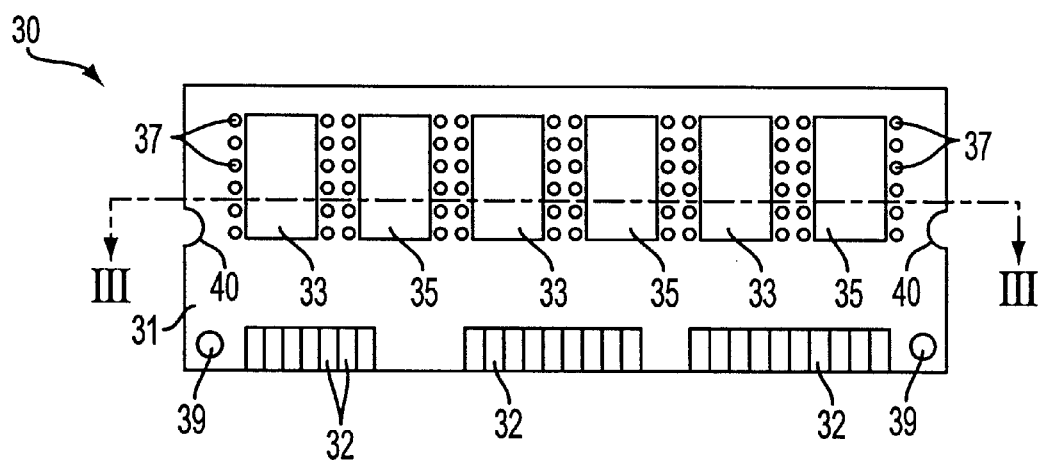
FIG. 3A is a top view of a mirrored memory module according to the present invention.
Figure 3B:
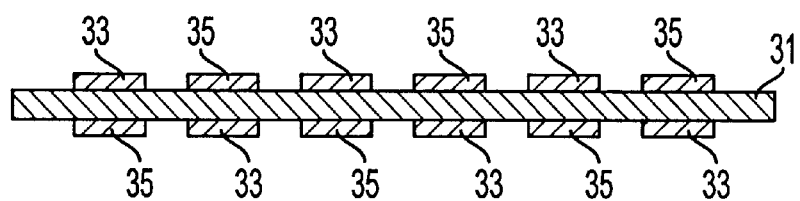
FIG. 3B is a sectional view along line III—III in FIG. 3A.
Figure 3C:
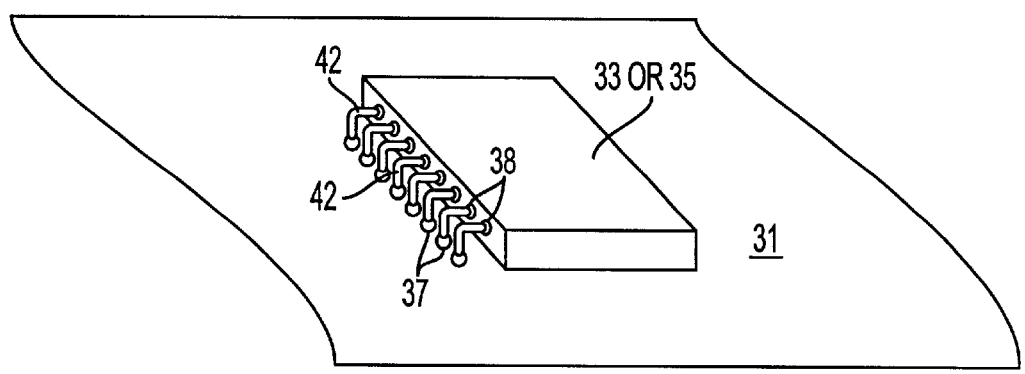
FIG. 3C is a partial view of a portion of a mirrored memory module showing connection between external terminals of a semiconductor device and module board electrical connectors.

The present invention also relates to mirrored memory modules which include at least one mirror pair of packaged memory chip devices having external terminal assignments in accordance with the present invention. Referring to FIGS. 3A–3C, there is shown a mirrored memory module 30 according to the present invention. The mirrored memory module comprises a module board 31, a plurality of module terminals 32 on an edge of the module board 31 which are designed to engage with a memory socket, a plurality of first packaged memory chip devices 33 of a mirrored pair having one of the mirrored pair terminal assignments and a plurality of second packaged memory chip devices 35 of a mirrored pair having the other mirrored terminal assignments positioned on the opposite sides of the module board 31 and connected to a wiring pattern on the module board 31. Each pair of packaged memory chip devices 33 and 35 thus form a mirrored pair of devices having terminals arranged in accordance with the present invention. The module board 31 includes module board electrical connectors 37 formed on both sides thereof. FIG. 3C shows one of memory chip devices 33 or 35, in which the external terminals 38 are formed as lead legs 42, each of which has one end soldered to a module board electrical connectors 37. The respective module board electrical connectors 37 can be electrically connected to the respective external terminals 38 of a packaged memory chip device in any other suitable way, as desired, for example, through a ball grid array which connects with terminals on an underside of a packaged chip device, in the manner shown in FIGS. 1A, 1C and 2, and as known in the art.

According to the invention, the packaged memory chip device 35 has a function assignment arrangement which is identical to the function assignment arrangement of a mirror image memory chip device 33. Each packaged semiconductor chip device 35 is preferably positioned opposite a mirror-image packaged semiconductor chip 33, such that each input-output terminal on a chip 33 on one side of the board is connected with the same input-output terminal on chip 35 on the other side of the board, each input only terminal on a chip 33 is connected with the same input only terminal on chip 35, each ground terminal on a chip 33 is connected with the same ground terminal on chip 35, each of the power for CMOS input and output pins terminal on a chip 33 is connected with the same power for CMOS input and output pins terminal on chip 35, each power for the RDRAM core and interface logic or for the RDRAM analog circuitry terminal on a chip 33 is connected with the same power for the RDRAM core and interface logic or for the RDRAM analog circuitry terminal on chip 35, and each power for threshold reference voltage for RSL signals terminal on a chip 33 is connected with the same power for threshold reference voltage for RSL signals terminal on chip 35. Moreover, as noted, the input-output, input-only, ground, power for CMOS input and output pins, power for RDRAM core and interface logic, and power for threshold reference voltage terminals are arranged such that no matter which of chips 33 and 35 is placed in a test device, the chip input-output, input only, ground, power for CMOS input output pins, power for RDRAM core and interface logic, and power for threshold reference voltage terminals will all align with the same functional terminals in the test device.

Preferably, the module board 31 is a printed circuit board. In a further preferred aspect of the invention, the module board (including the module board electrical connectors 37) is symmetrical, whereby an imaginary plane of symmetry can be drawn which bisects the thickness of the module board (the thickness being defined as the minimum distance from any point on the first side of the module board to any point on the second side of the module board). The module board 31 may be formed of any of a variety of materials and combinations of materials, one preferred example of which is a fire-retardant, epoxy resin/glass cloth laminate, commonly referred to as FR-4. Other high-performance boards based on such high glass-transition-temperature materials, such as polyamide-glass or cyanate-glass, may also be used to make the printed circuit boards.

The module board 31 shown in FIG. 3A has a generally rectangular cross-section, but it may have any suitable shape, in particular depending on the dimensions and functions of the items being positioned in or on the module board 31. In addition, in the memory module 30 shown in FIG. 3A, each of the semiconductor devices 33 and 35 are of the same type and size, and are arranged in rows extending longitudinally along both sides of the module board 31. The types and sizes of the semiconductor devices 33 and 35 can differ from one another, and the semiconductor devices 33 and 35 can be arranged other than in a line. In FIGS. 3A and 3B, the module board 31 includes a row of module terminals 32 along an edge the module board 31, e.g., for a standard DIMM connection. The module board 31 further includes holes 39, and notches 40, to assist alignment of the module terminals 32 with a socket or connector as is known in the art.

Figure 4:
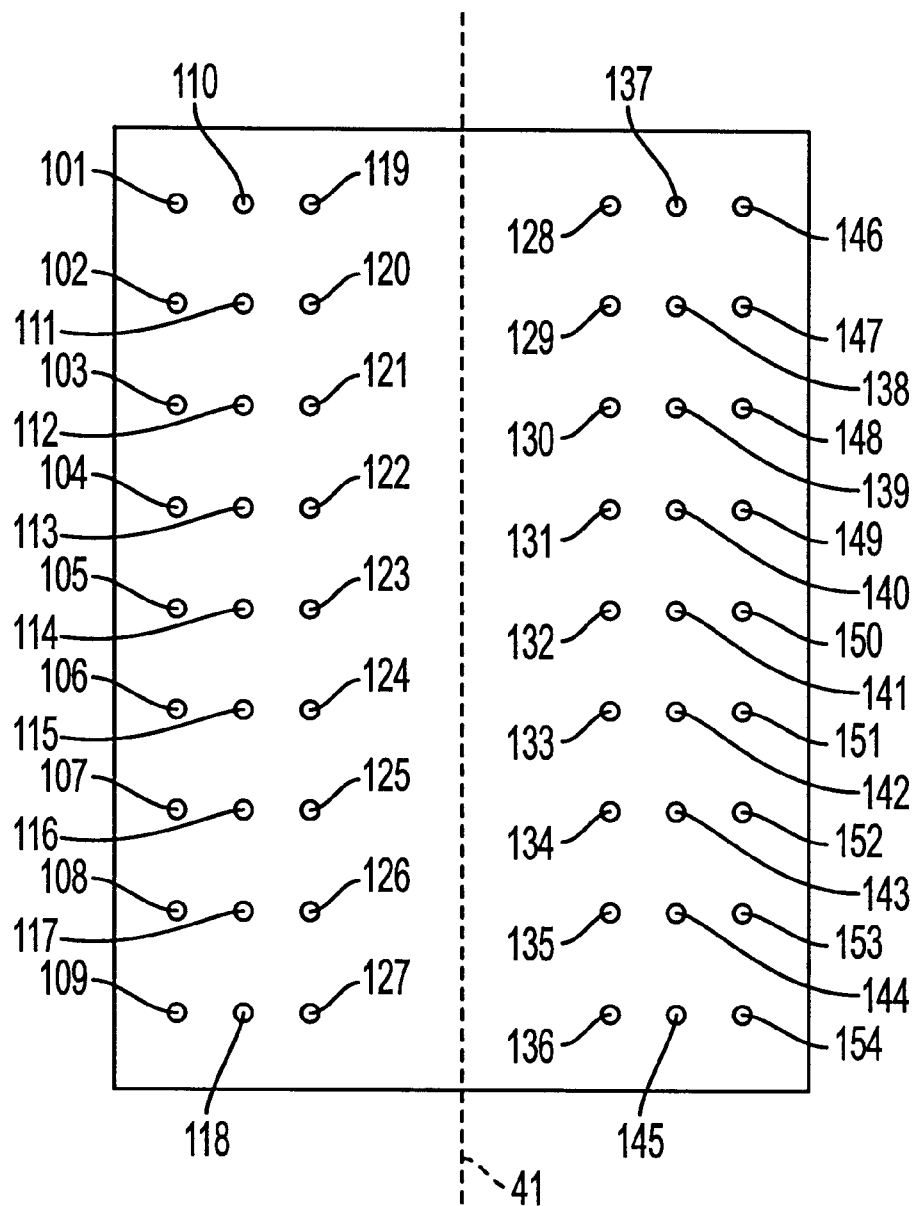
FIG. 4 is a schematic underside view of a packaged semiconductor device.

FIG. 4 is a schematic view of an underside of a packaged memory chip device 40 having an arrangement of external terminals 101–154 for use in housing RAMBUS® memory chips. As shown in FIG. 4, there are three columns of solder bump terminals on each side of an imaginary vertical axis 41. Each column of solder bumps includes nine terminals. Table 1 below is a schematic representation of the terminal assignments for external terminals 101–154 of FIG. 4 for a prior art RAMBUS® packaged memory chip device. Table 2 below is a schematic representation of the terminal assignments for external terminals 101–154 of FIG. 4 for a prior art packaged memory chip device which is a mirror pair of the packaged memory chip device having terminal assignments according to Table 1. Table 3 below is a schematic representation of the terminal assignments for a RAMBUS® packaged memory chip device, which is one chip of a mirrored pair, and in which the terminal assignments are arranged in accordance with the present invention. Table 4 below is a schematic representation of the terminal assignments for a packaged memory chip device which is the other chip of the mirrored pair having terminal assignments arranged according to the invention.

The following is a summary of descriptions of the pin-outs, and the respective functions thereof, in the prior art device depicted in Tables 1 and 2, and the exemplary embodiment of the present invention which is depicted in Tables 3 and 4. The pin-outs in this summary are only an example according to the present invention and are specific to a RAMBUS® memory chip. The invention is not limited to these assignments or any specific arrangement thereof or to a RAMBUS® chip, other than the mirroring aspects of the invention as described herein.

CFM refers to a clock from master pin which interfaces clock used for receiving RSL signals from a channel. These pins have positive polarity.

Function: input only

Type: RSL

CFMN refers to a clock from master pin which interfaces clock used for receiving RSL signals from a channel. These pins have negative polarity.

Function: input only

Type: RSL

CMD refers to command input pins use in conjunction with SIOo and SIO1 for reading from and writing to the control register. Such pins are also used for power management.

Function: input only

Type: CMOS

CTM refers to clock to master pins which interfaces clock used for transmitting RSL signals to the channel. These pins have positive polarity.

Function: input only

Type: RSL

CTMN refers to clock to master pins which interface clock used for transmitting RSL signals to the channel. These pins have negative polarity.

Function: input only

Type: RSL

DQ0, DQ1, DQ2, DQ3, DQ4, DQ5, DQ6, DQ7 and DQ8 refer to data byte A pins which carry a byte of read or write data between the channel and the RDRAM.

Function: input/output

Type: RSL

GND refers to ground reference pins for RDRAM core and interface.

Function: ground

GNDa refers to ground reference for RDRAM analog circuitry.

Function: ground

RQ0, RQ1, RQ2, RQ3 and RQ4 refer to column access control pins which contain control and address information for column accesses.

Function: input only

Type: RSL

RQ5, RQ6 and RQ7 refer to row access control pins which contain control and address information for row accesses.

Function: input only

Type: RSL

SCK refers to serial clock input pins which are a clock source used for reading from and writing to the control registers.

Function: input only

Type: CMOS

SIO0 and SIO1 refer to serial input and output pins for reading from and writing to the control registers using a serial access protocol. Such pins are also used for power management.

Function: input/output

Type: CMOS

VCMOS refers to supply voltage pins for CMOS input and output pins.

Function: power for CMOS input and output pins

VDD refers to supply voltage pins for the RDRAM core and interface logic.

Function: power for RDRAM core and interface logic

VDDa refers to supply voltage pins for the RDRAM analog circuitry.

Function: power for RDRAM analog circuitry

VREF refers to logic threshold reference voltage pins for RSL signals.

Function: power for threshold reference voltage for RSL signals

In the present example, RSL type pins register a logic 0 where a "higher" voltage is provided, and a logic 1 where a "lower" voltage is provided. It should be recognized that the present invention is not limited to specific voltages. In a representative example, however, suitable "lower" voltage for each of pin assignments CFM and CFMN is 0.1 V, and the "higher" voltage for these pin assignments is 0.7 V; and suitable "lower" voltage for each of pin assignments CFM and CFMN is 0.35 V, and the "higher" voltage for these pin assignments is 0.7 V. In the present example, suitable "lower" and "higher" voltages for pin assignments DQ0–DQ8 and RQ0–RQ7 depend on a number of other variables, e.g., timing conditions and the overall setup of pins and pin assignments, as is well known by those of skill in the art. Currently, conventional values for such voltages used are in the range of from 0.2 V to 1.8 V (as is well known, the conditions under which 0.2 V is used for the lower voltage differ from those under which 1.8 V is used for the higher voltage). Such voltages are not critical to the practice of the present invention, which is applicable to the use of any voltages.

In the present example, CMOS type pins register a logic 0 where a "lower" voltage is provided, and a logic 1 where a "higher" voltage is provided. As is well known by those skilled in the art, such values depend on the controller. The present invention is not limited to any particular voltage or range of voltages. For example, a representative higher voltage may be in the range of 2.5 V (e.g., in the range of from 2.37 V to 2.75 V), and a representative lower voltage may be in the range of 1.8 V (e.g., in the range of from 1.7 V to 2.0 V). Likewise, the voltage carried by the VCMOS depends on the controller, and may be in the range of 2.5 V (e.g., in the range of from 2.37 V to 2.75 V), or may be in the range of 1.8 V (e.g., in the range of from 1.7 V to 2.0 V).

In the present example, VDD and VDDa can have any suitable voltage, e.g., in the range of 2.5 V, such as 2.5 V±0.13 V. Likewise, VREF can have any suitable voltage, e.g., in the range of 1.4 V±0.2 V. The present invention is not limited to any particular voltage or range of voltages for such power pins.

TABLE 1

| Terminal 101 | Terminal 110 | Terminal 119 | Terminal 128 | Terminal 137 | Terminal 146 |
|---|---|---|---|---|---|
| DQ8 | VCMOS | SIO0 | SIO1 | GND | DQ7 |
| Terminal 102 | Terminal 111 | Terminal 120 | Terminal 129 | Terminal 138 | Terminal 147 |
| DQ3 | GND | DQ6 | DQ5 | VDD | DQ4 |
| Terminal 103 | Terminal 112 | Terminal 121 | Terminal 130 | Terminal 139 | Terminal 148 |
| RQ0 | GND | DQ2 | DQ1 | VDD | DQ0 |
| Terminal 104 | Terminal 113 | Terminal 122 | Terminal 131 | Terminal 140 | Terminal 149 |
| RQ4 | VDD | RQ1 | RQ2 | GND | RQ3 |
| Terminal 105 | Terminal 114 | Terminal 123 | Terminal 132 | Terminal 141 | Terminal 150 |
| CTM | GND | RQ7 | RQ6 | VDD | RQ5 |
| Terminal 106 | Terminal 115 | Terminal 124 | Terminal 133 | Terminal 142 | Terminal 151 |
| CTMN | GND | VREF | VDDa | GNDa | CFMN |
| Terminal 107 | Terminal 116 | Terminal 125 | Terminal 134 | Terminal 143 | Terminal 152 |
| DQ0 | VDD | DQI | DQ2 | GND | CFM |
| Terminal 108 | Terminal 117 | Terminal 126 | Terminal 135 | Terminal 144 | Terminal 153 |
| DQ3 | GND | DQ6 | DQ5 | VDD | DQ4 |
| Terminal 109 | Terminal 118 | Terminal 127 | Terminal 136 | Terminal 145 | Terminal 154 |
| DQ8 | VCMOS | SCK | CMD | GND | DQ7 |

TABLE 2

| Terminal 101 | Terminal 110 | Terminal 119 | Terminal 128 | Terminal 137 | Terminal 146 |
|---|---|---|---|---|---|
| DQ7 | GND | SIO1 | SIO0 | VCMOS | DQ8 |
| Terminal 102 | Terminal 111 | Terminal 120 | Terminal 129 | Terminal 138 | Terminal 147 |
| DQ4 | VDD | DQ5 | DQ6 | GND | DQ3 |
| Terminal 103 | Terminal 112 | Terminal 121 | Terminal 130 | Terminal 139 | Terminal 148 |
| DQ0 | VDD | DQ1 | DQ2 | GND | RQ0 |
| Terminal 104 | Terminal 113 | Terminal 122 | Terminal 131 | Terminal 140 | Terminal 149 |
| RQ3 | GND | RQ2 | RQ1 | VDD | RQ4 |
| Terminal 105 | Terminal 114 | Terminal 123 | Terminal 132 | Terminal 141 | Terminal 150 |
| RQ5 | VDD | RQ6 | RQ7 | GND | CTM |
| Terminal 106 | Terminal 115 | Terminal 124 | Terminal 133 | Terminal 142 | Terminal 151 |
| CFMN | GNDa | VDDa | VREF | GND | CTMN |
| Terminal 107 | Terminal 116 | Terminal 125 | Terminal 134 | Terminal 143 | Terminal 152 |
| CFM | GND | DQ2 | DQ1 | VDD | DQ0 |
| Terminal 108 | Terminal 117 | Terminal 126 | Terminal 135 | Terminal 144 | Terminal 153 |
| DQ4 | VDD | DQ5 | DQ6 | GND | DQ3 |
| Terminal 109 | Terminal 118 | Terminal 127 | Terminal 136 | Terminal 145 | Terminal 154 |
| DQ7 | GND | CMD | SCK | VCMOS | DQ8 |

TABLE 3

| Terminal 101 | Terminal 110 | Terminal 119 | Terminal 128 | Terminal 137 | Terminal 146 |
|---|---|---|---|---|---|
| DQ8 | GND | SIO0 | SIO1 | GND | DQ7 |
| Terminal 102 | Terminal 111 | Terminal 120 | Terminal 129 | Terminal 138 | Terminal 147 |
| DQ3 | VCMOS | DQ6 | DQ5 | VDD | DQ4 |
| Terminal 103 | Terminal 112 | Terminal 121 | Terminal 130 | Terminal 139 | Terminal 148 |
| DQ0 | VDD | DQ2 | DQ1 | VDD | DQ0 |
| Terminal 104 | Terminal 113 | Terminal 122 | Terminal 131 | Terminal 140 | Terminal 149 |
| RQ4 | GND | RQ1 | RQ2 | GND | RQ3 |
| Terminal 105 | Terminal 114 | Terminal 123 | Terminal 132 | Terminal 141 | Terminal 150 |
| RQ0 | VDD | RQ7 | RQ6 | VDD | RQ5 |
| Terminal 106 | Terminal 115 | Terminal 124 | Terminal 133 | Terminal 142 | Terminal 151 |
| CTMN | GND | VREF | VDDa | GNDa | CFMN |
| Terminal 107 | Terminal 116 | Terminal 125 | Terminal 134 | Terminal 143 | Terminal 152 |
| CTM | GND | DQ1 | DQ2 | GND | CFM |
| Terminal 108 | Terminal 117 | Terminal 126 | Terminal 135 | Terminal 144 | Terminal 153 |
| DQ3 | VCMOS | DQ6 | DQ5 | VDD | DQ4 |
| Terminal 109 | Terminal 118 | Terminal 127 | Terminal 136 | Terminal 145 | Terminal 154 |
| DQ8 | GND | SCK | CMD | GND | DQ7 |

TABLE 4

| Terminal 101 | Terminal 110 | Terminal 119 | Terminal 128 | Terminal 137 | Terminal 146 |
|---|---|---|---|---|---|
| DQ7 | GND | SIO1 | SIO0 | GND | DQ8 |
| Terminal 102 | Terminal 111 | Terminal 120 | Terminal 129 | Terminal 138 | Terminal 147 |
| DQ4 | VDD | DQ5 | DQ6 | VCMOS | DQ3 |
| Terminal 103 | Terminal 112 | Terminal 121 | Terminal 130 | Terminal 139 | Terminal 148 |
| DQ0 | VDD | DQ1 | DQ2 | VDD | DQ0 |
| Terminal 104 | Terminal 113 | Terminal 122 | Terminal 131 | Terminal 140 | Terminal 149 |
| RQ3 | GND | RQ2 | RQ1 | GND | RQ4 |
| Terminal 105 | Terminal 114 | Terminal 123 | Terminal 132 | Terminal 141 | Terminal 150 |
| RQ5 | VDD | RQ6 | RQ7 | VDD | RQ0 |
| Terminal 106 | Terminal 115 | Terminal 124 | Terminal 133 | Terminal 142 | Terminal 151 |
| CFMN | GNDa | VDDa | VREF | GND | CTMN |
| Terminal 107 | Terminal 116 | Terminal 125 | Terminal 134 | Terminal 143 | Terminal 152 |
| CFM | GND | DQ2 | DQ1 | GND | CTM |
| Terminal 108 | Terminal 117 | Terminal 126 | Terminal 135 | Terminal 144 | Terminal 153 |
| DQ4 | VDD | DQ5 | DQ6 | VCMOS | DQ3 |
| Terminal 109 | Terminal 118 | Terminal 127 | Terminal 136 | Terminal 145 | Terminal 154 |
| DQ7 | GND | CMD | SCK | GND | DQ8 |

Figure 5:
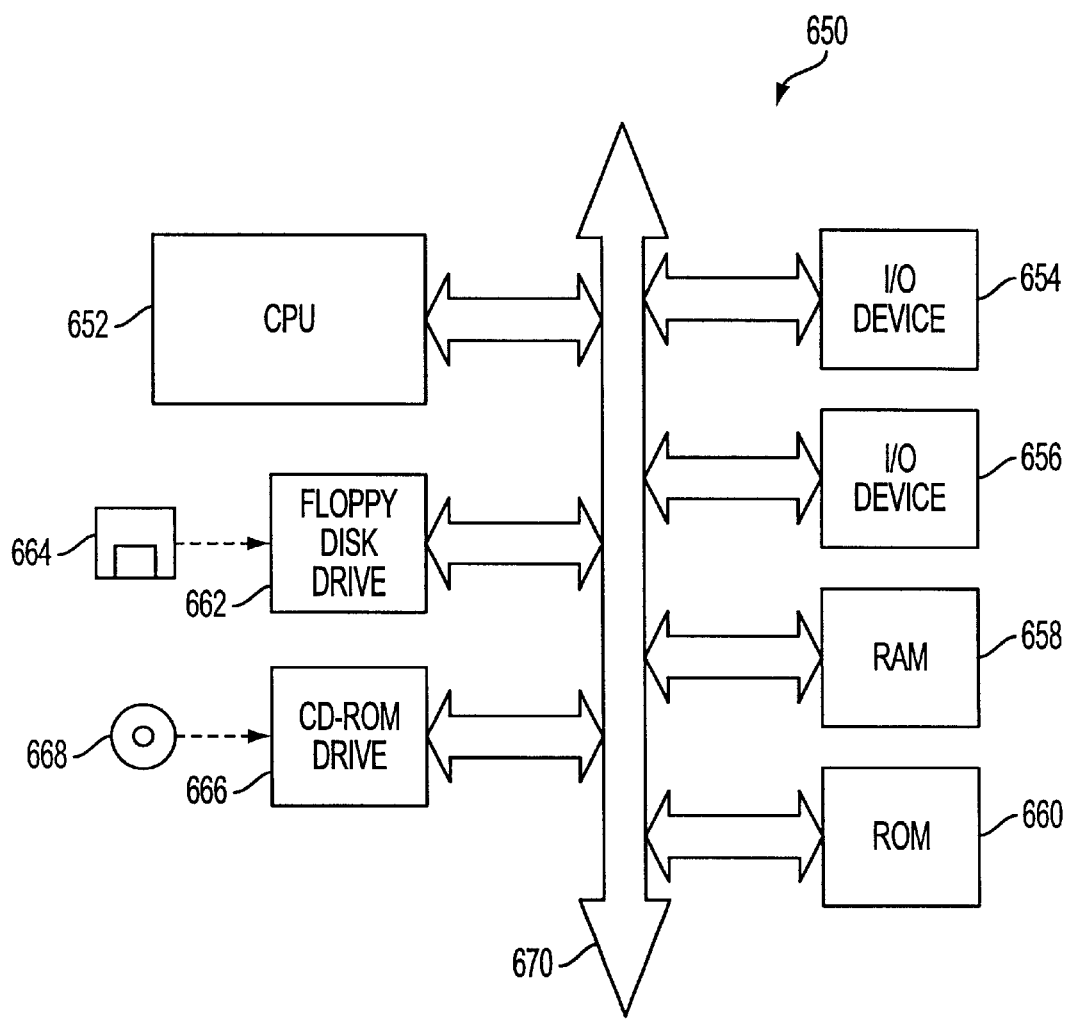
FIG. 5 is a schematic diagram of a computer system in which the process of the present invention can be implemented.

FIG. 5 depicts example of a processing system 650 in which a device according to the present invention can be incorporated. The system 650 includes a central processing unit (CPU) 652 that communicates with an input/output (I/O) device 654 over a bus 670. A second I/O device 656 is illustrated, but is not necessary to practice the present invention. The processing system 650 also includes a random access memory module (e.g., a DRAM module) according to the present invention, read only memory (ROM) 660 and may include peripheral devices such as a floppy disk drive 664 or a compact disk read only memory (CD-ROM) drive 666 that also communicate with the CPU 652 over the bus 670. The exact architecture of the processing system 650 is not critical, and any suitable combination of computer compatible devices may be incorporated into the processing system 650.

Although the embodiments described above relate to packaged semiconductor chip devices, the present invention is also applicable to unpackaged semiconductor chips. Packaged mirror pair semiconductor chips can be made where the respective dies in the two members of the mirror pair are substantially identical, and in which the mirror-imaging of the external terminals is accomplished through appropriate internal wiring within the die to external die bond pads. Thus, the two members of a mirror pair of unpackaged semiconductor chips would have different internal terminal arrangements, i.e., the external bond pad assignments of two mirrored chips would be mirror images of each other, as described above with reference to the external terminals of mirrored pair packaged chip devices.

The present invention achieves significant capital savings and process simplification, by providing a packaged semiconductor chip device which can be tested using the same test device as is used to test the mirror pair of the packaged semiconductor chip device. These benefits are of great importance in many instances, particularly in the manufacture of a dual sided memory module having mirrored semiconductor chip devices. In addition, the present invention eliminates the possibility of damage to the semiconductor chip device and/or the test device resulting from mismatching, because the arrangement of external terminals prevents mismatching any combination of an input-output external terminal, an input only external terminal, a ground external terminal, and a power terminal in one aspect of the invention. In another aspect of the invention the invention prevents mismatching of any combination of input-output external terminal, an input only external terminal, a ground terminal, a power for CMOS input and output pins external terminal, a power for the RDRAM core and interface logic or for the RDRAM analog circuitry external terminal, and a power for threshold reference voltage for RSL signals external terminal.

Although the articles and methods in accordance with the present invention have been described in connection with preferred embodiments, it will be appreciated by those skilled in the art that modifications not specifically described may be made and equivalent structures substitute for those described and illustrated without departing from the spirit and scope of the invention. Accordingly, the invention is not limited by the foregoing description, but is only limited by the scope of the appended claims.

What is claimed is:

1. A semiconductor chip device, comprising:
at least one semiconductor component, and
a plurality of terminals, each of said terminals being connected to internal circuitry of said component, said plurality of terminals comprising at least one input-output terminal, at least one input only terminal, at least one ground terminal, at least one power for CMOS input and output pins terminal, at least one power for the RDRAM core and interface logic or for the RDRAM analog circuitry terminal, and at least one power for threshold reference voltage for RSL signals terminal, said terminals being arranged in a terminal arrangement such that a mirror image of said semiconductor chip would have an input-output terminal at positions corresponding to positions on said semiconductor chip device where there is an input-output terminal, said mirror image of said semiconductor chip would have an input only terminal at positions corresponding to positions on said semiconductor chip device where there is an input only terminal, said mirror image of said semiconductor chip would have a ground terminal at positions corresponding to positions on said semiconductor chip device where there is a ground terminal, said mirror image of said semiconductor chip would have a power for CMOS input and output pins terminal at positions corresponding to positions on said semiconductor chip device where there is a power for CMOS input and output pins terminal, said mirror image of said semiconductor chip would have a power for the RDRAM core and interface logic or for the RDRAM analog circuitry terminal at positions corresponding to positions on said semiconductor chip device where there is a power for the RDRAM core and interface logic or for the RDRAM analog circuitry terminal, and said mirror image of said semiconductor chip would have a power for threshold reference voltage for RSL signals terminal at positions corresponding to positions on said semiconductor chip device where there is a power for threshold reference voltage for RSL signals terminal.

2. The semiconductor chip device as in claim 1, wherein said plurality of terminals are arranged whereby the two members of each of the following pairs of terminal assignments are in opposite positions relative to an imaginary axis bisecting said chip device:
DQ8-DQ7, DQ3-DQ4, DQ0-DQ0, RQ4-RQ3, RQ0-RQ5, CTMN-CFMN, CTM-CFM, DQ3-DQ4, DQ8-DQ7, GND-GND, VCMOS-VDD, VDD-VDD, GND-GDN, VDD-VDD, GND-GDNa, GND-GND, VCMOS-VDD, GND-GND, SIO0-SIO1, DQ6-DQ5, DQ2-DQ1, RQ1-RQ2, RQ7-RQ6, VREF-VDDa, DQ1-DQ2, DQ6-DQ5, and SCK-CMD.

3. The semiconductor chip device as is claim 2, wherein said plurality of terminals are arranged in a first column, a third column, a fourth column, a fifth column and a sixth column, said first column and said sixth column being opposite one another relative to said imaginary axis, said second column and said fifth column being opposite one another relative to said imaginary axis, said third column and said fourth column being opposite one another relative to said imaginary axis, said first column comprising nine terminal assignments in a sequence, from a top side of said chip device to a bottom side of said chip device, of DQ8-DQ3-DQ0-RQ4-RQ0-CTMN-CTM-DQ3-DQ8, said second column comprising nine terminal assignments in a sequence, from said top side of said chip device to said bottom side of said chip device, of GND-VCMOS-VDD-GND-VDD-GND-GND-VCMOS-GND, said third column comprising nine terminal assignments in a sequence, from said top side of said chip device to said bottom side of said chip device, of SIO0-DQ6-DQ2-RQ1-RQ7-VREF-DQ1-DQ6-SCK, said fourth column comprising nine terminal assignments in a sequence, from said top side of said chip device to said bottom side of said chip device, of SIO1-DQ5-DQ1-RQ2-RQ6-VDDa-DQ2-DQ5-CMD, said fifth column comprising nine terminal assignments is a sequence, from said top side of said chip device to said bottom side of side chip device, of GND-VDD-VDD-GND-VDD-GNDa-GND-VDD-GND, and said sixth column comprising nine terminal assignments in a sequence, from said top side of said chip device to said bottom side of said chip device, of DQ7-DQ4-DQ0-RQ3-RQ5-CFMN-CFM-DQ4-DQ7.

4. The semiconductor chip device as recited in claim 3, wherein said first column, said second column and said third column are on a left side of said chip device relative to said imaginary axis, and said fourth column, said fifth column and said sixth column are on a right side of said chip device relative to said imaginary axis.

5. The semiconductor chip device as recited in claim 3, wherein said first column, said second column and said third column are on a right side of said chip device relative to said imaginary axis, and said fourth column, said fifth column and said sixth column are on a left side of said chip device relative to said imaginary axis.

6. The semiconductor chip device as recited in claim 1, wherein said semiconductor chip device is a packaged device.

7. The semiconductor chip device as recited in claim 1, wherein said semiconductor chip device is a die device.

8. A memory chip device, comprising:
at least one memory circuit, and a plurality of externally accessible terminals, said terminals being arranged in six columns and nine rows, said terminals being arranged in said columns and rows according to the following table;

| DQ8 | GND | SIO0 | SIO1 | GND | DQ7 |
| DQ3 | VCMOS | DQ6 | DQ5 | VDD | DQ4 |
| DQ0 | VDD | DQ2 | DQ1 | VDD | DQ0 |
| RQ4 | GND | RQI | RQ2 | GND | RQ3 |
| RQ0 | VDD | RQ7 | RQ6 | VDD | RQ5 |
| CTMN | GND | VREF | VDDa | GNDa | CFMN |
| CTM | GND | DQI | DQ2 | GND | CFM |
| DQ3 | VCMOS | DQ6 | DQ5 | VDD | DQ4 |
| DQ8 | GND | SCK | CMD | GND | DQ7. |

9. A memory chip device, comprising:
at least one memory circuit, and a plurality of externally accessible terminals, said terminals being arranged in six columns and nine rows, said terminals being arranged in said columns and rows according to the following table;

| DQ7 | GND | SIO1 | SIO0 | GND | DQ8 |
| DQ4 | VDD | DQ5 | DQ6 | VCMOS | DQ3 |
| DQ0 | VDD | DQ1 | DQ2 | VDD | DQ0 |
| RQ3 | GND | RQ2 | RQ1 | GND | RQ4 |
| RQ5 | VDD | RQ6 | RQ7 | VDD | RQ0 |
| CFMN | GNDa | VDDa | VREF | GND | CTMN |
| CFM | GND | DQ2 | DQI | GND | CTM |
| DQ4 | VDD | DQ5 | DQ6 | VCMOS | DQ3 |
| DQ7 | GND | CMD | SCK | GND | DQ8. |

10. A test device comprising a test head, said test head having a plurality of test device pads, said plurality of test pads including at least one input-output test pad, at least one input only test pad, at least one ground test pad, at least one power for CMOS input and output pins test pad, at least one power for the RDRAM core and interface logic or for the RDRAM analog circuitry test pad, and at least one power for threshold reference voltage for RSL signals test pad, said test pads being arranged such that a mirror image of said test head would have an input-output test pad at positions corresponding to positions on said test head where there is an input-output test pad, said mirror image of said test pad would have an input only test pad at positions corresponding to positions on said test head where there is an input only test pad, said mirror image of said test pad would have a ground test pad at positions corresponding to positions on said test head where there is a ground test pad, said mirror image of said test pad would have a power for CMOS input and output pins test pad at positions corresponding to positions on said test head where there is a power for CMOS input and output pins test pad, said mirror image of said test pad would have a power for the RDRAM core and interface logic or for the RDRAM analog circuitry test pad at positions corresponding to positions on said test head where there is a power for the RDRAM core and interface logic or for the RDRAM analog circuitry test pad, and said mirror image of said test pad would have a power for threshold reference voltage for RSL signals test pad at positions corresponding to positions on said test head where there is a power for threshold reference voltage for RSL signals test pad.

11. A memory module comprising:
a module board;
a first set of module board electrical connectors positioned on a first side of said module board in a first module board electrical connector arrangement and a second set of module board electrical connectors positioned on a second side of said module board in a second module board electrical connector arrangement;
a first semiconductor chip device positioned on said first side of said module board, said first semiconductor chip device having a plurality of first chip terminals arranged in a first terminal arrangement, each of said first chip terminals being electrically connected to a respective one of said first electrical connectors;
a second semiconductor chip device positioned on said second side of said module board, said second semiconductor chip device having a plurality of second chip terminals arranged in a second terminal arrangement, each of said second chip terminals being electrically connected to a respective one of said second electrical connectors;
said first terminal arrangement being a mirror image of said second terminal arrangement, said first semiconductor chip device having a first terminal function assignment arrangement, said second semiconductor chip device having a second terminal function assignment arrangement which is identical to said first terminal function assignment arrangement.

12. The memory module as in claim 11, wherein said module board is symmetrical about a plane of symmetry positioned halfway between said first side of said module board and said second side of said module board.

13. The memory module as in claim 11, wherein said first chip terminals are arranged whereby the two members of each of the following pairs of terminal assignments are in opposite positions relative to a first imaginary axis bisecting said first chip device:
DQ8-DQ7, DQ3-DQ4, DQ0-DQ0, RQ4-RQ3, RQ0-RQ5, CTMN-CFMN, CTM-CFM, DQ3-DQ4, DQ8-DQ7, GND-GND, VCMOS-VDD, VDD-VDD, GND-GDN, VDD-VDD, GND-GDNa, GND-GND, VCMOS-VDD, GND-GND, SIO0-SIO1, DQ6-DQ5, DQ2-DQ1, RQ1-RQ2, RQ7-RQ6, VREF-VDDa, DQ1-DQ2, DQ6-DQ5, and SCK-CMD; and
said second chip terminals are arranged whereby the two members of each of the following pairs of terminal assignments are in opposite positions relative to a second imaginary axis bisecting said second chip device:
DQ8-DQ7, DQ3-DQ4, DQ0-DQ0, RQ4-RQ3, RQ0-RQ5, CTMN-CFMN, CTM-CFM, DQ3-DQ4, DQ8-DQ7, GND-GND, VCMOS-VDD, VDD-VDD, GND-GDN, VDD-VDD, GND-GDNa, GND-GND, VCMOS-VDD, GND-GND, SIO0-SIO1, DQ6-DQ5, DQ2-DQ1, RQ1-RQ2, RQ7-RQ6, VREF-VDDa, DQ1-DQ2, DQ6-DQ5, and SCK-CMD.

14. The memory module as in claim 13, wherein each terminal of said first and second chip device has an associated function, and the terminals of a said first chip device are connected to respective terminals of a said second memory device which have the same associated function.

15. The memory module as in claim 13, wherein said first chip terminals are arranged, from a left side of said first chip device to a right side of said first chip device, in a first column, a second column, a third column, a fourth column, a fifth column and a sixth column, said first column and said sixth column being opposite one another relative to said first imaginary axis, said second column and said fifth column being opposite one another relative to said first imaginary axis, said third column and said fourth column being opposite one another relative to said first imaginary axis, said first column comprising nine terminal assignments in a sequence, from a top side of said first chip device to a bottom side of side first chip device, of DQ8-DQ3-DQ0-RQ4-RQ0-CTMN-CTM-DQ3-DQ8, said second column comprising nine terminal assignments in a sequence, from said top side of said first chip device to said bottom side of said first chip device, of GND-VCMOS-VDD-GND-VDD-GND-GND-VCMOS-GND, said third column comprising nine terminal assignments in a sequence, from said top side of said first chip device to said bottom side of said first chip device, of SIO0-DQ6-DQ2-RQ1-RQ7-VREF-DQ1-DQ6-SCK, said fourth column comprising nine terminal assignments in a sequence, from said top side of said first chip device to said bottom side of said first chip device, of SIO1-DQ5-DQ1-RQ2-RQ6-VDDa-DQ2-DQ5-CMD, said fifth column comprising nine terminal assignments in a sequence, from said top side of said first chip device to said bottom side of said first chip device, of GND-VDD-VDD-GND-VDD-GNDa-GND-VDD-GND, and said sixth column comprising nine terminal assignments in a sequence, from said top side of said first chip device to said bottom side of said first device,of DQ7-DQ4-DQ0-RQ3-RQ5 CFMN-CFM-DQ4-DQ7; and wherein said second chip terminals are arranged, from a left side of said second chip device to a right side of said second chip device, in a seventh column, an eighth column, a ninth column, a tenth column, an eleventh column and a twelfth column, said seventh column and said twelfth column being opposite one another relative to said second imaginary axis, said eighth column and said eleventh column being opposite one another relative to said second imaginary axis, said ninth column and said tenth column being opposite one another relative to said second imaginary axis, said twelfth column comprising nine terminal assignments in a sequence, from a top side of said second chip device to a bottom side of said second chip device, of DQ8-DQ3-DQ0-RQ4-RQ0-CTMN-CTM-DQ3-DQ8, said eleventh column comprising nine terminal assignments in a sequence, from said top side of said of said second chip device to said bottom side of said second chip device, of GND-VCMOS-VDD-GND-VDD-GND-GND-VCMOS-GND, said tenth column comprising nine terminal assignments in a sequence, from said top side of said second chip device to said bottom side of said second chip device, of SIO0-DQ6-DQ2-RQ1-RQ7-VREF-DQ1-DQ6-SCK, said ninth column comprising nine terminal assignments in a sequence, from said top side of said second chip device to said bottom side of said second chip device, of SIO1-DQ5-DQ1-RQ2-RQ6-VDDa-DQ2-DQ5-CMD, said eight column comprising nine terminal assignments in a sequence, from said top side of said second chip device to said bottom side of said second chip device, of GND-VDD-VDD-GND-VDD-GNDa-GND-VDD-GND, and said seventh column comprising nine terminal assignments in a sequence, from said top side of said second chip device to said bottom side of said second chip device, of DQ7-DQ4-DQ0-RQ3-RQ5-CFMN-CFM-DQ4-DQ7.

16. A memory module comprising:
a module board;
a plurality of first module board electrical connector sets, each first module board electrical connector set comprising a set of electrical connectors, and a plurality of second module board electrical connector sets, each second module board electrical connector set comprising a set of electrical connectors;
a plurality of first semiconductor chip devices, each of said first semiconductor chip devices having a set of first chip terminals arranged in a first terminal arrangement, each of the terminals in each said set of first chip terminals being electrically connected to a respective one of said first electrical connectors;
a plurality of second semiconductor chip devices, each of said second semiconductor chip devices having a set of second chip terminals arranged in a second terminal arrangement, each of the terminals in each said set of second chip terminals being electrically connected to a respective one of said second electrical connectors;
said first terminal arrangement being a mirror image of said second terminal arrangement, said first semiconductor chip device having a first terminal function assignment arrangement, said second semiconductor chip device having a second terminal function assignment arrangement which is identical to said first terminal function assignment arrangement.

17. The memory module as in claim 16, wherein said module board is symmetrical about a plane of symmetry positioned halfway between said first side of said module board and said second side of said module board.

18. The memory module as in claim 16, wherein each said first chip terminals are arranged whereby the two members of each of the following pairs of terminal assignments are in opposite positions relative to a first imaginary axis bisecting said first chip device:
DQ8-DQ7, DQ3-DQ4, DQ0-DQ0, RQ4-RQ3, RQ0-RQ5, CTMN-CFMN, CTM-CFM, DQ3-DQ4, DQ8-DQ7, GND-GND, VCMOS-VDD, VDD-VDD, GND-GDN, VDD-VDD, GND-GDNa, GND-GND, VCMOS-VDD, GND-GND, SIO0-SIO1, DQ6-DQ5, DQ2-DQ1, RQ1-RQ2, RQ7-RQ6, VREF-VDDa, DQ1-DQ2, DQ6-DQ5, and SCK-CMD; and said second chip terminals are arranged whereby the two members of each of the following pairs of terminal assignments are in opposite positions relative to a second imaginary axis bisecting said second chip device:
DQ8-DQ7, DQ3-DQ4, DQ0-DQ0, RQ4-RQ3, RQ0-RQ5, CTMN-CFMN, CTM-CFM, DQ3-DQ4, DQ8-DQ7, GND-GND, VCMOS-VDD, VDD-VDD, GND-GDN, VDD-VDD, GND-GDNa, GND-GND, VCMOS-VDD, GND-GND, SIO0-SIO1, DQ6-DQ5, DQ2-DQ1, RQ1-RQ2, RQ7-RQ6, VREF-VDDa, DQ1-DQ2, DQ6-DQ5, and SCK-CMD.

19. The memory module as in claim 18, wherein each terminal of said first and second chip device has an associated function, and the terminals of a said first chip device are connected to respective terminals of a said second memory device which have the same associated function.

20. The memory module as in claim 18, wherein said first chip terminals are arranged, from a left side of said first chip device to a right side of said first chip device, in a first column, a second column, a third column, a fourth column, a fifth column and a sixth column, said first column and said sixth column being opposite one another relative to said first imaginary axis, said second column and said fifth column being opposite one another relative to said first imaginary axis, said third column and said fourth column being opposite one another relative to said first imaginary axis, said first column comprising nine terminal assignments in a sequence, from a top side of said first chip device to a bottom side of side first chip device, of DQ8-DQ3-DQ0-RQ4-RQ0-CTMN-CTM-DQ3-DQ8, said second column comprising nine terminal assignments in a sequence, from said top side of said first chip device to said bottom side of said first chip device, of GND-VCMOS-VDD-GND-VDD-GND-GND-VCMOS-GND, said third column comprising nine terminal assignments in a sequence, from said top side of said first chip device to said bottom side of said first chip device, of SIO0-DQ6-DQ2-RQ1-RQ7-VREF-DQ1-DQ6-SCK, said fourth column comprising nine terminal assignments in a sequence, from said top side of said first chip device to said bottom side of said first chip device, of SIO1-DQ5-DQ1-RQ2-RQ6-VDDa-DQ2-DQ5-CMD, said fifth column comprising nine terminal assignments in a sequence, from said top side of said first chip device to said bottom side of said first chip device, of GND-VDD-VDD-GND-VDD-GNDa-GND-VDD-GND, and said sixth column comprising nine terminal assignments in a sequence, from said top side of said first chip device to said bottom side of said first device,of DQ7-DQ4-DQ0-RQ3-RQ5 CFMN-CFM-DQ4-DQ7; and wherein said second chip terminals are arranged, from a left side of said second chip device to a right side of said second chip device,in a seventh column, an eighth column, a ninth column, a tenth column, an eleventh column and a twelfth column, said seventh column and said twelfth column being opposite one another relative to said second imaginary axis, said eighth column and said eleventh column being opposite one another relative to said second imaginary axis, said ninth column and said tenth column being opposite one another relative to said second imaginary axis, said twelfth column comprising nine terminal assignments in a sequence, from a top side of said second chip device to a bottom side of said second chip device, of DQ8-DQ3-DQ0-RQ4-RQ0-CTMN-CTM-DQ3-DQ8, said eleventh column comprising nine terminal assignments in a sequence, from said top side of said of said second chip device to said bottom side of said second chip device, of GND-VCMOS-VDD-GND-VDD-GND-GND-VCMOS-GND, said tenth column comprising nine terminal assignments in a sequence, from said top side of said second chip device to said bottom side of said second chip device, of SIO0-DQ6-DQ2-RQ1-RQ7-VREF-DQ1-DQ6-SCK, said ninth column comprising nine terminal assignments in a sequence, from said top side of said second chip device to said bottom side of said second chip device, of SIO1-DQ5-DQ1-RQ2-RQ6-VDDa-DQ2-DQ5-CMD, said eight column comprising nine terminal assignments in a sequence, from said top side of said second chip device to said bottom side of said second chip device, of GND-VDD-VDD-GND-VDD-GNDa-GND-VDD-GND, and said seventh column comprising nine terminal assignments in a sequence, from said top side of said second chip device to said bottom side of said second chip device, of DQ7-DQ4-DQ0-RQ3-RQ5-CFMN-CFM-DQ4-DQ7.

21. A processor system comprising:
a processor; and
a memory device coupled to said processor, said memory device comprising:
   a module board;
   a first set of module board electrical connectors positioned on a first side of said module board in a first module board electrical connector arrangement and a second set of module board electrical connectors positioned on a second side of said module board in a second module board electrical connector arrangement;
   at least one first semiconductor chip device positioned on said first side of said module board, said first semiconductor chip device having a plurality of first chip terminals arranged in a first terminal arrangement, each of said first chip terminals being electrically connected to a respective one of said first electrical connectors;
   at least one second semiconductor chip device positioned on said second side of said module board, said second semiconductor chip device having a plurality of second chip terminals arranged in a second terminal arrangement, each of said second chip terminals being electrically connected to a respective one of said second electrical connectors;
   said first terminal arrangement being a mirror image of said second terminal arrangement, said first semiconductor chip device having a first function assignment arrangement, said second semiconductor chip device having a second function assignment arrangement which is identical to said first function assignment arrangement.

22. The system as in claim 21, wherein said processor system is a workstation or a computer.

23. The system as in claim 21, wherein each of said first chip terminals are arranged whereby the two members of each of the following pairs of terminal assignments are in opposite positions relative to a first imaginary axis bisecting said first chip device:
DQ8-DQ7, DQ3-DQ4, DQ0-DQ0, RQ4-RQ3, RQ0-RQ5, CTMN-CFMN, CTM-CFM, DQ3-DQ4, DQ8-DQ7, GND-GND, VCMOS-VDD, VDD-VDD, GND-GDN, VDD-VDD, GND-GDNa, GND-GND, VCMOS-VDD, GND-GND, SIO0-SIO1, DQ6-DQ5, DQ2-DQ1, RQ1-RQ2, RQ7-RQ6, VREF-VDDa, DQ1-DQ2, DQ6-DQ5, and SCK-CMD,
   and wherein said second chip terminals are arranged whereby the two members of each of the following pairs of terminal assignments are in opposite position relative to a second imaginary axis bisecting said second chip device:
DQ8-DQ7, DQ3-DQ4, DQ0-DQ0, RQ4-RQ3, RQ0-RQ5, CTMN-CFMN, CTM-CFM, DQ3-DQ4, DQ8-DQ7, GND-GND, VCMOS-VDD, VDD-VDD, GND-GDN, VDD-VDD, GND-GDNa, GND-GND, VCMOS-VDD, GND-GND, SIO0-SIO1, DQ6-DQ5, DQ2-DQ1, RQ1-RQ2, RQ7-RQ6, VREF-VDDa, DQ1-DQ2, DQ6-DQ5, and SCK-CMD.

24. The system as in claim 23, wherein each of said first chip terminals are arranged, from a left of said first chip device to a right side of said first chip device, in a first column, a second column, a third column, a fourth column, a fifth column and a sixth column, said first column and said sixth column being opposite one another relative to said first imaginary axis, said second column and said fifth column being opposite one another relative to said first imaginary axis, said third column and said fourth column being opposite one another relative to said first imaginary axis, said first column comprising nine terminal assignments in a sequence, from a top side of said first chip device to a bottom side of said first chip device, of DQ8-DQ3-DQ0-RQ4-RQ0-CTMN-CTM-DQ3-DQ8, said second column comprising nine terminal assignments in a sequence, from said top side of said first chip device to said bottom side of said first chip device, of GND-VCMOS-VDD-GND-VDD-GND-GND-VCMOS-GND, said third column comprising nine terminal assignments in a sequence, from said top side first chip device to said bottom side of said first chip device, of SIO0-DQ6-DQ2-RQ1-RQ7-VREF-DQ1-DQ6-SCK, said fourth column comprising nine terminal assignments in a sequence, from said top said of said first chip device to said bottom side first chip device, of SIO1-DQ5-DQ1-RQ2-RQ6-VDDa-DQ2-DQ5-CMD, said fifth column comprising nine terminal assignments in a sequence, from said top side of said first chip device to said bottom side of said first chip device, of GND-VDD-VDD-GND-VDD-GNDa-GND-VDD-GND, and said sixth column comprising nine terminal assignments in a sequence, from said top side of said first chip device to said bottom side of said first chip device, of DQ7-DQ4-DQ0-RQ3-RQ5-CFMN-CFM-DQ4-DQ7;

and wherein said second chip terminals are arranged, from a left side of said second chip device to a right side of said second chip device, in a seventh column, an eighth column, an eight column, a ninth column, an then column, and a eleventh column, and twelfth column, another relative to said second imaginary axis, said ninth column and said tenth column being opposite one another relative to said second imaginary axis, said twelfth column comprising nine terminal assignments in a sequence, from a top side of said second chip device to a bottom side of said second chip device, of DQ8-DQ3-DQ0-RQ4-RQ0-CTMN-CTM-DQ3-DQ8, said eleventh column comprising nine terminal assignments in a sequence, from said top side of said second chip device to a said of said second chip device,of GND-VCMOS-VDD-GND-VDD-GND-GND-VCMOS-GND, said tenth column comprising nine terminal assignments in a sequence, from said top side of said second chip device to said bottom side of said second chip device, of SIO0-DQ6-DQ2-RQ1-RQ7-VREF-DQ1-DQ6-SCK, said ninth column comprising nine terminal assignments in a sequence, from said top side of said second chip device to said bottom side of said second chip device, of SIO1-DQ5-DQ1-RQ2-RQ6-VDDa-DQ2-DQ5-CMD, said eight column comprising nine terminal assignments in a sequence, from said top side of said second chip device to said bottom side of said second chip device, of GND-VDD-VDD-GND-VDD-GNDa-GND-VDD-GND, and said seventh column comprising nine terminal assignments in a sequence, from said top side of said second chip device to said bottom side of said second chip device, of DQ7-DQ4-DQ0-RQ3-RQ5-CFMN-CFM-DQ4-DQ7.

25. The system as in claim 21, wherein said memory device is a package device.

26. The system as is claim 21, wherein said memory device is a die device.

* * * * *

UNITED STATES PATENT AND TRADEMARK OFFICE
CERTIFICATE OF CORRECTION

PATENT NO. : 6,307,769 B1
DATED : October 23, 2001
INVENTOR(S) : James P. Nuxoll et al.

It is certified that error appears in the above-identified patent and that said Letters Patent is hereby corrected as shown below:

Column 5,
Line 22, changed from "itself" to -- itself), --.

Column 16,
Line 32, change from "is" to -- in --.
Lines 33-34, change from "a first column, a third column" to -- a first column, a second column, a third column --.
Line 55, change from "is" to -- in --.

Column 21,
Line 30, change from "RQ5 CFMN" to -- RQ5-CFMN --.

Column 23,
Line 11, change from "side first" to -- side of said first --.
Line 15, change from "said top said of said first" to -- said top side of said first. --.
Line 16, change from "side first" to -- side of said first. --.
Line 25, through column 24, line 26, change to:

-- and wherein said second chip terminals are arranged, from a left side of said second chip device to a right side of said second chip device, in a seventh column, and eighth column, a ninth column, a tenth column, an eleventh column, and a twelfth column, said seventh column and said twelfth column being opposite one another relative to said second imaginary axis, said eighth column and said eleventh column being opposite one another relative to said second imaginary axis, said ninth column and said tenth column being opposite one another relative to said second imaginary axis, said twelfth column comprising nine terminal assignments in a sequence, from a top side of said second chip device to a bottom side of said second chip device, of DQ8-DQ3-DQ0-RQ4-RQ0-CTMN-CTM-DQ3-DQ8, said eleventh column comprising nine terminal assignments in a sequence, from said top side of said second chip device to said bottom side of said second chip device, to said bottom side of said said second chip device, of GND-VCMOS-VDD-GND-VDD-GND-GND-VCMOS-GND, said tenth column comprising nine terminal assignments in sequence, from said top side of said second chip device to said bottom side of said second chip device, of SIO0-DQ6-DQ2-RQ1-RQ7-VREF-DQ1-DQ6-SCK, said ninth column comprising nine terminal assignments in a

UNITED STATES PATENT AND TRADEMARK OFFICE
CERTIFICATE OF CORRECTION

PATENT NO.     : 6,307,769 B1
DATED          : October 23, 2001
INVENTOR(S)    : James P. Nuxoll et al.

It is certified that error appears in the above-identified patent and that said Letters Patent is hereby corrected as shown below:

<u>Column 23, line 25 through column 24, line 26 cont'd,</u>
sequence, from said top side of said second chip device to said bottom side of said second chip device, of SIO1-DQ5-DQ1-RQ2-RQ6-VDDa-DQ2-DQ5-CMD, said eighth column comprising nine terminal assignments in a sequence, from said top side of said second chip device to said bottom side of said second chip device, of GND-VDD-VDD-GND-VDD-GNDa-GND-VDD-GND, and said seventh column comprising nine terminal assignments in a sequence, from said top side of said second chip device to said bottom side of said second chip device, of DQ7-DQ4-DQ0-RQ3-RQ5-CFMN-CFM-DQ4-DQ7. --

Signed and Sealed this

Twenty-seventh Day of August, 2002

Attest:

JAMES E. ROGAN
Attesting Officer        Director of the United States Patent and Trademark Office